United States Patent
Gneupel

(10) Patent No.: US 11,307,247 B2
(45) Date of Patent: Apr. 19, 2022

(54) PROBER WITH BUSBAR MECHANISM FOR TESTING A DEVICE UNDER TEST

(71) Applicant: Infineon Technologies AG, Neubiberg (DE)

(72) Inventor: Andreas Gneupel, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 171 days.

(21) Appl. No.: 16/778,708

(22) Filed: Jan. 31, 2020

(65) Prior Publication Data
US 2020/0249273 A1 Aug. 6, 2020

(30) Foreign Application Priority Data
Jan. 31, 2019 (DE) .............. 10 2019 102 457.9

(51) Int. Cl.
*G01R 31/28* (2006.01)

(52) U.S. Cl.
CPC ..... *G01R 31/2889* (2013.01); *G01R 31/2887* (2013.01); *G01R 31/2896* (2013.01)

(58) Field of Classification Search
CPC .............. G01R 1/0466; G01R 1/07314; G01R 31/2879; G01R 31/2886; G01R 31/2889; G01R 31/2896
See application file for complete search history.

(56) References Cited

U.S. PATENT DOCUMENTS

| | | |
|---|---|---|
| 4,697,143 A | 9/1987 | Lockwood et al. |
| 4,897,598 A * | 1/1990 | Doemens ........... G01R 1/07371 324/500 |
| 5,757,027 A | 5/1998 | Kuchta |
| 9,255,338 B2 | 2/2016 | Prado |
| 2002/0171133 A1 | 11/2002 | Mok et al. |
| 2006/0170435 A1 | 8/2006 | Granicher et al. |
| 2010/0213960 A1* | 8/2010 | Mok ................... G01R 31/2889 324/762.03 |
| 2012/0169367 A1 | 7/2012 | Kuo et al. |
| 2019/0107557 A1* | 4/2019 | Murata ............... G01R 1/0433 |

FOREIGN PATENT DOCUMENTS

| | | |
|---|---|---|
| CN | 102012440 | 4/2011 |
| CN | 103797161 | 5/2014 |
| CN | 106802386 | 6/2017 |
| CN | 108957281 | 12/2018 |
| JP | 2006118983 | 5/2006 |
| TW | 201312132 | 3/2013 |

OTHER PUBLICATIONS

Luo Qingman, Research on High Precision Motion Platform for Probe Station, Issue 2, Feb. 15, 2015.
Andreas Gneupel, et al., Characterization Critical Condition for Fracture during Wafer testing by FEM and Experiments, vol. 67, Aug. 15, 2017.
P. Nicolay, Co-Simulation of Passive and Wireless Surfaces Acoustic Wave Sensor, vol. 5, Issue 5, Oct. 31, 2016.

* cited by examiner

*Primary Examiner* — Tung X Nguyen
(74) *Attorney, Agent, or Firm* — Dicke, Billig & Czaja, PLLC

(57) ABSTRACT

Prober for a test system for testing a device under test is disclosed. In one example, the prober comprises a busbar mechanism for transporting electric signals to and away from the device under test.

19 Claims, 3 Drawing Sheets

PROBER WITH BUSBAR MECHANISM FOR TESTING A DEVICE UNDER TEST

CROSS-REFERENCE TO RELATED APPLICATION

This Utility Patent Application claims priority to German Patent Application No. 10 2019 102 457.9, filed Jan. 31, 2019, which is incorporated herein by reference.

BACKGROUND

Technical Field

Various embodiments relate generally to a prober for a test system for testing a device under test, a test system, a method of testing a device under test, and a retrofitting method.

Description of the Related Art

After completing manufacture of semiconductor chips or packages of such semiconductor chips, such products are usually tested concerning their function. For this purpose, a test system composed of a prober and an electric test unit are provided in which such products are tested as devices under test (DUT).

However, a parasitic impedance of the test system may reduce accuracy or may even falsify electric signals applied and/or detected during testing the DUT. This may deteriorate reliability of the test. Moreover, a high parasitic impedance may damage the DUT and/or the test equipment.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
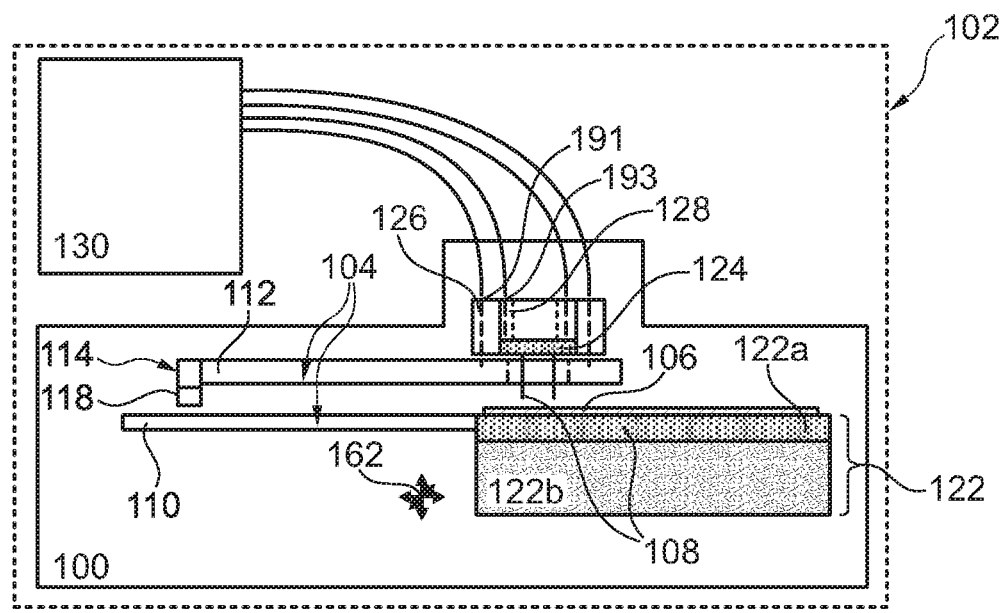
FIG. 1 shows a schematic view of a test system comprising an electric test unit and a prober according to an exemplary embodiment.

There may be a need for safely and reliably testing a device under test.

According to an exemplary embodiment, a prober for a test system for testing a device under test is provided, wherein the prober comprises a busbar mechanism for transporting electric signals to and away from the device under test.

According to another exemplary embodiment, a test system for testing a device under test is provided, wherein the test system comprises a prober having the above-mentioned features and an electric test unit coupled with the prober for supplying electric stimulus signals to the prober (in particular for supplying electric stimulus signals to the device under test on the prober) and for analyzing electric response signals from the prober (in particular for analyzing electric response signals from the device under test on the prober).

According to yet another exemplary embodiment, a method of testing a device under test is provided, wherein the method comprises conducting an electric signal to or from the device under test by a prober (in particular by a prober having the above-mentioned features) via a first busbar plate, a contact mechanism (in particular an electrically conductive bar), and a second busbar plate.

According to yet another exemplary embodiment, a method is provided which comprises retrofitting an existing wafer prober for a test system so that the retrofitted prober is configured for testing wafers with a busbar mechanism.

According to an exemplary embodiment, a prober for a test system is provided in which the transmission of electric signals between the prober and an electric test unit is accomplished by a busbar mechanism rather than by lengthy electric cables. As a result of the implementation of a busbar mechanism for signal transport, testing of a device under test can be carried out with a significantly lower value of inductance. Such a parasitic inductance may, descriptively speaking, have the impact of an undesired electric energy storage which, during operation of the test system for testing a device under test, may supply the stored or buffered energy to the wafer or other device under test. Thus, a high parasitic inductance of a test system or prober may result in a deterioration or even damage of the device under test. By implementing the busbar mechanism, the inductance may be significantly reduced and the test of the devices under test can be carried out without yield loss due to damaged devices under test. Simultaneously, inaccuracies of the test may be reduced.

This advantage may be particularly pronounced when the device under test is a semiconductor wafer, in particular a semiconductor wafer composed of semiconductor power chips which require a dynamic test, i.e. a test using the application of fast changing signals. Exemplary embodiments may hence implement a technically superior busbar principle for a wafer prober. Such a low inductance concept may be applied to wafers of all dimensions, but may be also compatible with large wafer dimensions such as 300 mm diameter or more.

Description of Further Exemplary Embodiments

In the following, further exemplary embodiments of the prober, the test system, and the methods will be explained.

In the context of the present application, the term "device under test" (DUT) may particularly denote an electronic component such as a semiconductor wafer or a semiconductor chip which shall be tested concerning its desired functionality after manufacture. In particular, the device under test may be an electronic member configured as a power semiconductor wafer or chip, in particular for automotive applications.

In the context of the present application, the term "prober" may particularly denote a handling device for handling devices under test, in particular semiconductor wafers, in terms of testing their functionality by a test system. In particular, a prober may be the mechanical part of a test system which may cooperate with an electric test unit as an electronic part of the test system in terms of testing devices under test. An electric test of such a device under test may require the application of electric stimulus signals to one or both opposing main surfaces of the device under test, for instance to pads or other electrically conductive parts of chips of a wafer. The test may also require the detection and processing of electric response signals in reply to the application of the stimulus signals, wherein the response signals may be detected from one or both opposing main surfaces of the device under test, depending on the particularities of a certain application.

In the context of the present application, the term "busbar mechanism" may particularly denote an arrangement of at least two bulky electrically conductive bodies such as plates which may be connected electrically to one another. One of the bodies or plates may cooperate with electrically conductive contacts of a chuck carrying the device under test, and the opposing other body or plate may be used for cooperating with the before mentioned body or plate for accomplishing a connection with the electric test unit. Descriptively speaking, such an arrangement of two electrically coupled or electrically couplable electrically conductive bodies such as plates may be interpreted as a parallel connection of inductances. According to physical laws, a parallel arrangement of multiple inductances sums up in a reciprocal way so that the provision of a busbar mechanism may significantly reduce the inductance of the electric signal transporting busbar mechanism.

In an embodiment, the busbar mechanism is configured as a movable busbar mechanism. A movable busbar mechanism may be a busbar mechanism in which at least one member thereof, in particular one of the at least two plates of electrically conductive material thereof, can be spatially moved during operation of the prober. Thus, by moving one of the plates with respect to another one of the plates during operation of the prober, it is possible to bring the two plates in a configuration in which they are electrically coupled during transporting electric signals. It is however also possible to move one of the plates with respect to the other one in order to change a contacting position of the prober. During such a motion, it is also possible that the electrically conductive connection between the two plates is at least temporarily interrupted.

In an embodiment, the prober is configured as a wafer prober for testing chips (in particular semiconductor chips) on a wafer as device under test. Thus, the prober may be configured for testing a wafer, in particular a plurality of electronic chips which are still integrally connected in the wafer compound. The wafer and its electronic chips may have electrically conductive pads and/or other electrically conductive parts on one or both opposing main surfaces thereof which need to be contacted to apply electric test signals and to measure electric response signals for testing functionality of the electronic chips and the wafer as a whole. Such a wafer prober may be capable of accommodating the wafer on a planar surface of a chuck having electrically conductive portions which are contacted with electrically conductive parts on one main surface of the wafer. A needle card, for instance, having a plurality of electrically conductive needles may contact pads on an opposing other main surface of the wafer placed on the chuck.

In an embodiment, the prober comprises electrically conductive contact elements for applying an electric stimulus signal to at least one side of the device under test and for detecting an electric response signal in response to the applied electric stimulus signal on at least one side of the device under test. The mentioned electrically conductive elements may be needles or pogo pins (i.e. spring-loaded electrically conductive contacts) contacting pads and/or other electrically conductive parts on one main surface of the wafer or other devices under test. Other contact elements may be planar electrically conductive regions on a surface of the chuck on which the device under test may be placed. When the device under test is sandwiched between electrically conductive elements on both opposing main surfaces, it is possible to carry out electric tests by applying electric stimulus signals and by measuring electric response signals on respective ones of the pads and/or other electrically conductive parts via respective ones of the contact elements. Thanks to the above-described busbar mechanism, the parasitic inductance involved by the measurement process can remain small.

In an embodiment, the busbar mechanism comprises an at least partially electrically conductive first busbar plate for conducting an electric signal to or from the device under test and comprises an at least partially electrically conductive second busbar plate for conducting the same electric signal to or from the device under test. The two busbar plates may be made of an electrically conductive material and may cooperate to significantly reduce the parasitic inductance when an electric signal travels along one busbar plate via a contact mechanism to the other busbar plate to propagate there along an opposing direction as compared to a propagation direction on the first busbar plate. By this mechanism, the parasitic inductance may be significantly reduced.

In an embodiment, the first busbar plate is a bottom side busbar plate and the second busbar plate is a top side busbar plate. For instance, the first busbar plate may be placed at the same vertical level and laterally side by side with a chuck carrying a device under test such as a wafer. The second busbar plate should be preferably arranged above the device under test to avoid the risk of collisions. The second busbar plate may be located below a board (for instance printed circuit board) of the needle card. Needles for contacting an upper main surface of the device under test and extending downwardly from the board of the needle card may have free ends below the second busbar plate.

In an embodiment, the first busbar plate is a movable busbar plate. By moving the first busbar plate together with the chuck and the device under test relative to the first busbar plate and the needle card, a respective portion of the device under test (in particular one or multiple electronic chips) being presently tested may be selected. The motion may be in a horizontal plane so as to scan the device under test during the testing process. The motion may also be perpendicular to this horizontal plane so that the device under test may be lowered with respect to the needles of the needle card before moving the device under test together with the first busbar plate and the chuck relative to the needle card.

In an embodiment, the second busbar plate is a spatially fixed busbar plate. For instance, the spatially fixed plate may be mechanically mounted on but electrically insulated from a housing of the prober. In order to keep the number of movable parts small, the second busbar plate may simply be configured as a fixed busbar plate. Also the needle card cooperating with the second busbar plate may be configured as a spatially fixed member.

In an embodiment, the second busbar plate has a larger surface area than the first busbar plate. With such a configuration, there is always a respective portion of the second busbar plate cooperating with the first busbar plate in accordance with the busbar principle during moving the first busbar plate.

In an embodiment, at least one of the first busbar plate and the second busbar plate may be covered with an electrically conductive layer.

In an embodiment, the prober comprises a contact mechanism configured for selectively establishing an electric contact between the first busbar plate and the second busbar plate. During carrying out the actual electric test of the device under test, the first busbar plate and the second busbar plate should be electrically coupled by the contact mechanism. However, while scanning the device under test by moving the chuck together with the first busbar plate, such a connection may be temporarily interrupted to avoid collisions or scratching.

In an embodiment, the contact mechanism comprises an electrically conductive bar. For example, the electrically conductive bar may be a linear electrically conductive bar. Although this space-saving shape is advantageous, other shapes are possible, for instance a curved shape. It is however preferred that the electrically conductive bar extends over an entire dimension of the busbar mechanism or at least one busbar plate thereof, so that a small inductance and a small electric resistance can be obtained. The electrically conductive bar may be mounted on or may form part of one of the first busbar plate and the second busbar plate. In particular, the contact mechanism may be configured for establishing an electric contact between the first busbar plate and the second busbar plate when the device under test is contacted by contact elements (in particular from above) or during conducting electric signals to and/or from the device under test. The contact mechanism may also be configured for disabling an electric contact between the first busbar plate and the second busbar plate while moving the first busbar plate and the second busbar plate relatively to one another, in particular in a horizontal plane and with a vertical spacing between the busbar plates. By forming the contact mechanism from an electrically conductive body extending along a certain direction, the busbar mechanism may be used very efficiently. Descriptively speaking, the extended electrically conductive bar is technically comparable with a large number of paralleled individual inductances which sum up to a relatively small parasitic inductance value.

In an embodiment, the prober comprises a chuck connected, in particular laterally, to the first busbar plate and configured for carrying the device under test. An upper portion of the chuck may be configured as a contact structure (in particular in form of a metal plate) having contact elements being connected with the first busbar plate and being connectable with a lower main surface of the device under test. Thus, the contact structure of the chuck may comprise (in particular planar) electrically conductive contact elements connected to the first busbar plate and configured for contacting the device under test from a bottom side. Said contact structure may be electrically insulated with respect to a mounting portion of the chuck. The chuck may hence serve as a mechanical mounting base for mounting the device under test thereon. However, the chuck may also have an electrically conductive surface in form of said contact structure so that mounting the device under test on the chuck may simultaneously establish an electrically conductive connection between electrically conductive contacts on the lower main surface of the device under test and the mounting surface of the chuck.

In an embodiment, the prober comprises a needle card comprising electrically conductive contact elements (in particular in the form of needles) configured for contacting the device under test. In particular, said contact elements may contact the device under test from a top side. The needle card may comprise one or more electrically conductive needles extending or protruding downwardly from a main body of the needle card so that free ends of the electrically conductive needles contact electrically conductive contacts on the upper main surface of the device under test, in particular pads on a top surface of the wafer. Via the needles of the needle card and via the electrically conductive portions of the chuck, electric signals may be supplied to and detected from the device under test during carrying out the electric test.

In an embodiment, the prober comprises a first contact ring comprising multiple electric contacts (in particular multiple spring-loaded pins) connected with the second busbar plate and connectable (in particular via the contact mechanism) with the first busbar plate. The prober may also comprise a second contact ring comprising multiple electric contacts (in particular multiple further spring-loaded pins) connected to a needle card. The second busbar plate may be connected with the electric test unit by the first contact ring. The needle card may be connected with the electric test unit by the second contact ring. For instance, the first contact ring may be an exterior contact ring enclosing or surrounding the interior second contact ring. Highly advantageously, the contact rings may continue the busbar principle towards the electric test unit which additionally reduces the parasitic inductance in cooperation with the above described busbar mechanism. For instance, a plurality of electrically conductive contacts may be arranged in a ring structure on the first contact ring and/or on the second contact ring. For example, each of the contact elements may be pogo pins, i.e. spring-loaded pins. This may allow a safe electric contacting via the pogo pins.

In another embodiment, the prober comprises a first contact plate (in particular configured as a vertical plate) connected with the second busbar plate and connectable (by the contact mechanism) with the first busbar plate. The prober may also comprise a second contact plate (in particular configured as a further vertical plate, more particularly arranged in parallel to the first vertical plate) connected to the needle card. As an alternative to the concentric provision of cylindrical or ring-like contacts as described above, the presently described embodiment uses (preferably vertically arranged) electrically conductive contact plates continuing the busbar principle towards the electric test unit. This may further reduce the parasitic inductance in cooperation with the above described busbar mechanism.

In an embodiment, the method comprises testing integrally connected dies or chips of a wafer as the device under test, in particular a wafer having a diameter of at least 200 mm, more particularly at least 300 mm. In particular with a semiconductor wafer of large dimensions up to 300 nm diameter and more, conventional prober concepts may be no longer applicable and available. However, the busbar principle has significant advantages in particular with such large wafers resulting in a suppressed parasitic inductance and a higher yield.

In an embodiment, the method comprises testing, as the device under test, a wafer comprising a plurality of power semiconductor chips. In particular when testing power semiconductor chips, dynamic test sequences using non-constant test signals become necessary. With such test sequences, the issue with a parasitic inductance becomes particularly pronounced. Thus, the implementation of a busbar principle is particularly advantageous in terms of testing power semiconductor chips.

In an embodiment, the method comprises testing, as the device under test, a wafer comprising a plurality of semiconductor chips having a vertical current flow between two opposing main surfaces. Testing semiconductor chips with a vertical current flow (for instance transistor chips) may implement pads and/or other electrically conductive parts on both opposing main surfaces of the wafer under test. Thus, the busbar principle may be particularly advantageous for such an application.

In an embodiment, the method comprises testing the device under test using test signals which change quickly over time. In contrast to static tests in which constant or relatively slowly changing electric signals are applied to a device under test, the application of non-constant or rapidly changing signals with short pulse lengths (in the order of magnitude of tenth of nanoseconds) is particularly critical. Therefore, the implementation of the busbar principle in the prober according to an exemplary embodiment is particularly advantageous for such an application.

In an embodiment, the electronic chip is a FET (Field Effect Transistor) transistor chip having a source pad, a drain pad and a gate pad or may be an IGBT (Insulated Gate Bipolar Transistor) chip having a collector pad, an emitter pad and gate pad as the at least one pad. In particular, the source pad and the gate pad may be formed on the same main surface of the electronic chip and may be each coupled with a respective contact element. The drain pad may be formed on an opposing other main surface of the electronic chip. Such a transistor chip may be a chip fulfilling the function of a transistor, in particular of a field effect transistor. Such a transistor chip may be used for instance for semiconductor power applications.

In an embodiment, the at least one electronic chip comprises at least one of the group consisting of a controller circuit, a driver circuit, and a power semiconductor circuit. All these circuits may be integrated into one semiconductor chip, or separately in different chips. For instance, a corresponding power semiconductor application may be realized by the chip(s), wherein integrated circuit elements of such a power semiconductor chip may comprise at least one transistor (in particular a FET, Field Effect Transistor or IGBT, Isolated Gate Bipolar Transistor), at least one diode, etc. In particular, circuits fulfilling a half-bridge function, a full-bridge function, etc., may be manufactured.

As substrate or wafer for the semiconductor chips, a semiconductor substrate, preferably a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

According to an embodiment, a variable length power busbar of a wafer prober for reduced or even minimized parasitic inductance is provided.

Power semiconductors are in many cases vertical devices, i.e. chips with a vertical current flow. In case of power semiconductor transistors, the drain pad/collector pad is in many cases located at the back side of the chip. Therefore, in wafer test, the back side of a corresponding wafer can be electrically contacted to the wafer chuck of the prober. The chuck may then move the wafer along all three spatial axes. The electrical connection to fixed parts of the prober may be conventionally done with a flexible chuck cable. The current flows through the chip and the chuck cable back to the tester interface, which may also be denoted as electric test unit. This chuck cable represents a significant parasitic inductance. For static tests that are standard in wafer test (such as measurement of breakthrough voltage, Ron, VCEsat, leakage) this is no big issue.

However, static tests are for certain applications no longer sufficient for properly testing power discrete semiconductors. Dynamic test content (such as measurement of avalanche, switch-off, double pulse) is needed for certain applications to increase the test coverage in wafer testing and to bring it closer to the coverage of a BE-test (for instance IGBT (insulated gate bipolar transistor) module test). For this, the above-described parasitic inductance may be undesired. Effects of a significant parasitic inductance can damage wafer and test equipment and can even make dynamic tests (where a high dI/dt value, i.e. a high derivative of the current I over time t, may be required) impossible at all.

According to an exemplary embodiment, an efficient mechanism to reduce the parasitic inductance is implemented in a test system for testing devices under test such as wafers, namely a busbar principle. With a busbar mechanism implemented in a prober for a test system for testing devices under tests, it may be possible to force the current to flow not through wires with circular diameter, but through spatially extended, for instance planar, conductors with a high ratio between width and distance.

Such a busbar mechanism to reduce the parasitic inductance of a prober of a test system for testing devices under test can be considered as a virtual parallelization of many wired current paths. Each of them has a certain inductance. The parallelization of multiple of such inductances $L_1$, $L_2$, . . . reduces total inductance $L_{total}$ according to the equation $1/L_{total}=1/L_1+1/L_2+ \ldots$ . Measurements with a special pulse current inductance measurement system showed inductance values of an assembly according to an exemplary embodiment in the range of 10 nH only.

To use a corresponding busbar mechanism in a wafer prober for replacing a conventional chuck cable being a significant source of parasitic inductance, two busbar plates made of a metallic material can be implemented. One of these metal plates can be mounted to the chuck stage and may thus move within a horizontal plane. The other plate can be mounted fix, for instance to a prober head plate (i.e. a massive metal part comprising an upper housing panel and a reference seating of the prober). Both plates can be selectively electrically connected by a contact mechanism, such as a linear contactor. Since the two busbar plates belong to the same voltage domain, an optional insulating layer on their surface is not of much concern.

In addition to the advantageous busbar principle, a reduction of a current path length and therewith the enclosed loop area may be an additional effective measure for further improving the impedance characteristics of the prober. In particular in combination, this may result in an outstanding low parasitic inductance.

Advantageously, the busbar principle cannot only be realized inside the prober, but may be further extended in a preferred embodiment. In such an embodiment, all currents or signals can be routed up, through the head plate, to a prober-tester-interface board. To extend the busbar principle here too, an arrangement of two concentric contact rings (which may be denoted as "tube-planes") may be provided, for instance in the form of an outer pogo ring tower and an inner pogo ring tower.

In an embodiment, the described busbar mechanism can be used as an upgrade kit to an existing standard prober. So, the parts determining the mechanical accuracy (such as probe card tilt, planarity), may purely stay with the existing standard prober (such as head plate, inserts). The busbar mechanism can then be implemented and retrofitted with relatively high tolerances, which keeps the implementation effort low.

For instance, a module manufacturer may efficiently and reliably test chips in form of bare dies. The tested chips may then be used for manufacturing modules, for instance IGBT modules. When using a prober according to an exemplary embodiment, this may improve the module yield and reliability. Without dynamic tests, as enabled by exemplary embodiments, in particular large wafers (for instance 300 mm diameter wafers) lack significant test content. In particular sophisticated modules, which may contain a plurality of (for instance twelve or more) chips (such as IGBT chips) plus optionally a similar or the same amount of passive devices (such as diodes), are conventionally classified as waste, when only one chip is failing a dynamic test. With exemplary embodiments, it may be possible to find this failing chip already in dynamic testing on wafer level and thereby increase the module yield. In particular, a reduced yield loss and a better quality may be achieved by exemplary embodiments in view of a better test coverage and defect detection on wafer level.

Descriptively speaking, a prober can be considered as the mechanical part of a test system. In such a prober for testing devices under test (such as electronic power chips of a semiconductor wafer), the device under test can be loaded from a reservoir onto a chuck of the prober. An electric test unit may be connected with the prober for supplying electric stimulus signals to the device under test and for processing electric response signals received from the device under test in response to the application of the stimulus signals. Conventionally, this can be achieved by cables having a length of typically 1 m to 2 m. According to an exemplary embodiment, this is accomplished by a busbar mechanism, i.e. by elongated electrically conductive plates connected or connectable with one another. This may result in a current flow along the busbar mechanism which can be considered as a parallel connection of multiple individual inductances. Due to the reciprocal summation of the individual inductances to a net or total parasitic inductance, a corresponding busbar mechanism may significantly reduce the parasitic inductance of the prober.

While for conventional static tests of wafers and their chips with time constants in the order of magnitude of milliseconds, the parasitic inductance has not been a significant issue due to the involved substantially constant signals, power semiconductor chips of a large wafer need to be tested also using dynamic tests to get the whole picture concerning functionality. Certain chip defects can only be detected by dynamic rather than static tests. During such a dynamic test, electric test signals having a duration in the order of magnitude between 10 ns and 100 ns may be applied. In such a scenario, the parasitic inductance contributed by the prober may play a significant role, may significantly deteriorate the accuracy of the test and may even damage the power semiconductor chips during testing. Descriptively speaking, such a parasitic impedance may function like an energy storage which, under certain circumstances, may supply unintentionally the stored energy to the wafer which may deteriorate or destroy the latter. Thus, the substitution of a conventional cable connection by a busbar mechanism may increase the yield.

In particular, an exemplary embodiment may provide a low inductance connection between a chuck having electrically conductive areas in contact with a lower main surface of the wafer with the electric test unit via the busbar mechanism. It may also be possible to provide a low inductance connection between needles of a needle card contacting an upper main surface of the wafer with the electric test unit. Such an architecture has turned out particularly advantageous for power semiconductor chips and for very large wafers having for instance a diameter of 300 mm or more.

When implementing a busbar mechanism in a prober, the obtainable parasitic inductances may be as low as 10 nH. For comparison, conventional approaches using cables having a length of 1 m to 2 m, the parasitic inductance may be around 1000 nH. Even when applying conventional approaches for reducing the parasitic inductance, such as the provision of a separate second lateral chuck in addition to a main chuck carrying the wafer, this does not allow to reduce the parasitic impedance below around 100 nH. Descriptively speaking, by implementing a busbar mechanism in the prober, elongated cables may be substituted by two elongated and spatially extended electrically conductive plates being selectively connectable by a contact mechanism such as an electrically conductive bar. Thereby, a plurality of inductances may be connected in parallel which may significantly reduce the effective parasitic inductance.

Advantageously, an exemplary embodiment provides a movable or spatially variable busbar mechanism by which the busbar plates may be selectively coupled for the actual test operation during which electric signals are applied, and may be electrically decoupled in time intervals during which the busbar plates are moved relative to one another to bring a specific chip or chip portion or number of chips in alignment with needles of a needle card for carrying out an electric test on a specific portion of the device under test.

According to a particularly preferred embodiment, the inductance reducing impact of the busbar mechanism may be synergetically supported by the provision of circular cylindrical connection bodies such as contact rings for indirectly connecting the upper and lower main surface, respectively, of the device under test. One of such contact rings may contact the upper main surface of the device under test via the needle card. The other contact ring may contact the lower main surface of the device under test via the busbar mechanism, i.e. via both busbar plates and the connecting contact mechanism. Such contact rings may comprise a circumferential array of multiple contact pins as electric contacts for guiding the signals into the prober and out of the prober. When these contact pins are implemented as pogo pins, i.e. as spring-loaded electric contacts, the reliability of the electric connection may be further improved. At the same time, such an architecture may further reduce the parasitic inductance, since the busbar mechanism may be further extended by such contact rings from a functional point of view.

As an alternative to such cylindrical ring-shaped connectors, it is also possible to use vertical plates which may function in a corresponding way for further reducing the parasitic inductance. One of such vertical plates may contact the upper main surface of the device under test via the needle card. The other vertical plate may contact the lower main surface of the device under test via the busbar mechanism, i.e. via both busbar plates and the connecting contact mechanism.

FIG. 1 shows a schematic view of a test system 102 comprising an electric test unit 130 and a prober 100 according to an exemplary embodiment.

The test system 102 serves for testing a device under test 106, which is here a semiconductor wafer composed of a plurality of integrally connected transistor chips. In particular, the test system 102 is configured for testing the device under test 106 using non-constant or rapidly changing signals. The prober 100 forms the mechanical part of the test system 102 and is used for handling the device under test 106. The electric test unit 130 is coupled with the prober 100 and serves for supplying electric stimulus signals to the prober 100 and for analyzing electric response signals from the prober 100 in terms of the test. The prober 100 comprises electrically conductive contact elements 108 (which will be described below in further detail) for applying the electric stimulus signals to at least one side of the device under test 106 and for detecting the electric response signals in response to the applied electric stimulus signals on at least one side of the device under test 106.

The prober 100 comprises a busbar mechanism 104 for transporting electric signals to and away from the device under test 106, more precisely to a lower main surface of the device under test 106. The busbar mechanism 104 is configured as a movable busbar mechanism 104, as indicated schematically by reference numeral 162. More precisely, the busbar mechanism 104 comprises a movable planar first busbar plate 110 and a spatially fixed planar second busbar plate 112.

The electrically conductive first busbar plate 110 and the electrically conductive second busbar plate 112 conduct electric signals to and from a lower main surface of the device under test 106. The first busbar plate 110 is a bottom side plate which is placed in the shown embodiment at a same level as or below the device under test 106. The second busbar plate 112 is a top side busbar plate and is placed above the device under test 106 in the shown embodiment.

Beyond this, the prober 100 comprises a contact mechanism 114 configured for selectively establishing an electric contact between the first busbar plate 110 and the second busbar plate 112 (not shown in FIG. 1), or for disabling an electric contact between the first busbar plate 110 and the second busbar plate 112 (as shown in FIG. 1). The contact mechanism 114 comprises an electrically conductive bar 118 which is here embodied in form of a linear electrically conductive bar on the second busbar plate 112. In the shown embodiment, the electrically conductive bar 118 extends perpendicular to the paper plane of FIG. 1. Moreover, the contact mechanism 114 is configured for establishing an electric contact between the first busbar plate 110 and the second busbar plate 112 when the device under test 106 is contacted by the contact elements 108.

In order to establish such an electric contact, the first busbar plate 110 (in particular together with chuck 122) is moved upwardly according to FIG. 1 until its upper main surface contacts the lower main surface of the electrically conductive bar 118. In an embodiment, the amount according to which the first busbar plate 110 is moved upwardly together with chuck 122 may be defined by the contact system composed of reference numerals 106 and 108. A corresponding overdrive of about 100 μm can be established in this context.

In an embodiment, it is however also possible that the contact mechanism 114 carries out an additional vertical downward motion (for instance by about 500 μm) in order to guarantee a reliable connection between the electrically conductive bar 118 and the first busbar plate 110.

The electric contact between the busbar plates 110, 112 may be established via the contact mechanism 114 during conducting electric signals to and/or from the device under test 106. Furthermore, the contact mechanism 114 is configured for disabling an electric contact between the first busbar plate 110 and the second busbar plate 112 while moving the first busbar plate 110 and the second busbar plate 112 relatively to one another within a horizontal plane. In the operation state according to FIG. 1, no electric contact is established between the busbar plates 110, 112 by the contact mechanism 114. When moving the first busbar plate 110 upwardly (and optionally also reference numerals 118/114 downwardly) until an upper main surface of the first busbar plate 110 establishes an electric contact with the bottom surface of the electrically conductive bar 118, the busbar plates 110, 112 are electrically connected (not shown in FIG. 1). In the latter mentioned operation mode, the busbar plates 110, 112 connected by the conductive bar 118 form an extended substantially U-shaped structure along which a current may flow between the device under test 106 and the electric test unit 130.

Moreover, the prober 100 comprises a chuck 122 connected laterally to the first busbar plate 110 and configured for carrying the device under test 106. Furthermore, the chuck 122 is configured for electrically contacting a lower main surface of the device under test 106 by planar electrically conductive contact elements 108 on an upper main surface of the chuck 122. More precisely, an upper portion of the chuck 122 may be configured as a contact structure 122a (in particular in form of a metal plate) having one or more contact elements 108 being connected with the first busbar plate 110 and being connected with a lower main surface of the device under test 106 according to FIG. 1. Said contact structure 122a may be electrically insulated with respect to a mounting portion 122b of the chuck 122 serving as a mounting base for the device under test 106.

A needle card 124 of the prober 100 is configured for contacting an upper main surface of the device under test 106 by vertically protruding electrically conductive contact elements 108 extending downwardly from the needle card 124. As shown, the electrically conductive contact elements 108 of the needle card 124 extend downwardly through the second busbar plate 112, for instance through one or more through holes in the second busbar plate 112.

As illustrated in FIG. 1 schematically and described in further detail referring to FIG. 2 to FIG. 5, the prober 100 also comprises a first contact ring 126 comprising multiple circumferentially arranged electric contacts 191 (for instance pogo pins). The first contact ring 126 may be denoted as a pogo ring since the electric contacts 191 may be embodied as a plurality of pogo pins arranged in a ring or annular shape. Furthermore, the prober 100 may comprise a second contact ring 128 comprising multiple circumferentially arranged electric contacts 193 (for instance pogo pins). The second contact ring 128 may also be denoted as a pogo ring since the electric contacts 193 may be embodied as a plurality of pogo pins arranged in a ring or annular shape.

More specifically, the second busbar plate 112 is connected with the electric test unit 130 by the electric contacts 191 of the first contact ring 126. The needle card 124 may be connected with the electric test unit 130 by the electric contacts 193 of the second contact ring 128. In the shown embodiment, the first contact ring 126 is an exterior contact ring enclosing the interior second contact ring 128.

In the shown embodiment, the prober 100 with the busbar mechanism 104 is configured as a wafer prober for testing a wafer as device under test 106. More specifically, the prober 100 is configured for testing, as the device under test 106, a wafer comprising a plurality of power semiconductor chips, each having, just as an example for a vertical power device, an integrated field effect transistor (FET) or, isolated gate bipolar transistor (IGBT), or diode, experiencing a vertical current flow between two opposing main surfaces during operation.

It is also possible to retrofit an existing conventional wafer prober for testing wafers, not having a busbar mechanism, with a busbar mechanism 104, as the one shown in FIG. 1 and described above.

The test system 102 shown in FIG. 1 functions as follows: A wafer composed of typically hundreds to ten thousands of integrally connected power semiconductor chips is mounted as a device under test 106 on an upper main surface of the chuck 122. As a result, electrically conductive parts on the lower main surface of the wafer may be contacted with corresponding one or more electric contacts 108 being provided as planar surface structures of the mounting surface of the chuck 122. Thus, by mounting the device under test 106 on the chuck 122, the electrically conductive parts are automatically electrically connected with the chuck 122. When the semiconductor power chips of the device under test 106 are transistor chips, the drain or collector contacts may form the pads and/or other electrically conductive parts being contacted with the chuck 122. During testing the electronic chips of the device under test 106, a vertical current flow may occur through the device under test 106. At an upper main surface of the device under test 106, pads may be provided. When the semiconductor power chips of the wafer forming the device under test 106 are transistor chips, these pads may be source or emitter pads and gate pads. These pads can be contacted during an electric test by the needles of the needle card 124, corresponding to the contact elements 108 protruding downwardly from the main body of the needle card 124.

Laterally of the chuck 122, the electrically conductive first busbar plate 110 is arranged and electrically connected with the electrically conductive contact structure 122a of chuck 122. When the first busbar plate 110 is raised (and electrically conductive bar 118 is optionally lowered by the contact mechanism 114) until an electrically conductive contact with the contact bar 118 is established, the first busbar plate 110 is also electrically coupled with the contact mechanism 114 and the second busbar plate 112. Via the electric contacts 191 of the contact ring 126 contacting the second busbar plate 112, an uninterrupted connection with the electric test unit 130 may then be established.

Furthermore, the needle card 124 is electrically connected via the electric contacts 193 of the second contact ring 128 with electric test unit 130.

While the needle card 124 together with the second busbar plate 112 are spatially fixed, the chuck 122 together with the first busbar plate 110 and the device under test 106 are movable in a horizontal plane according to FIG. 1 as well as along a vertical direction. For bringing the needles or contact elements 108 of the needle card 124 in contact with a certain sub-portion of the pads on an upper main surface of the device under test 106, the chuck 122 together with the first busbar plate 110 and the device under test 106 may be raised and contact bar 118 is lowered by contact mechanism 114 so that the contact bar 118 establishes an electric contact with the first busbar plate 110. A part of the electric test may then be carried out. Subsequently, the chuck 122 together with the first busbar plate 110 and the device under test 106 may be lowered so that the contact bar 118 loses its electric contact with the first busbar plate 110. Further subsequently, the chuck 122 together with first busbar plate 110 and the device under test 106 may be moved horizontally to a new target position. After having reached the desired horizontal target position for contacting specific ones of the pads and/or other electrically conductive parts of the device under test 106, the chuck 122 together with the first busbar plate 110 and the device under test 106 may be vertically raised again so as to establish a new electric contact between the contact elements 108 of the needle card 124 and the upper pads, and at the same time an electric contact is established between the contact bar 118 and the first busbar plate 110. Now, other electric signals may be applied under control of the electric test unit 130 to the device under test 106 in a low inductance way. Descriptively speaking, the current flow during applying test signals and detecting electric signals may be horizontally along the first busbar plate 110, vertically through the contact bar 118 and again horizontally (but in an opposite direction) along the second busbar plate 112.

While an electrically conductive connection is established between the busbar plates 110, 112 by the contact mechanism 114 and the contact bar 118, the flow of electric signals is as follows: A first electric connection path is established between the electric test unit 130, via the first contact ring 126 and its multiple electric contacts 191, the second busbar plate 112, the contact mechanism 114/contact bar 118, the first busbar plate 110 and the contact element(s) 108 of the chuck 122 up to the lower main surface of the device under test 106. A second electric connection path is established between the electric test unit 130, via the second contact ring 128 and its multiple electric contacts 193 and the needle card 124 with its multiple contact elements 108 up to the upper main surface of the device under test 106. A vertical current flow through the device under test 106 is possible as well.

As a result of the low inductance configuration according to FIG. 1, the device under test 106 may be safely prevented from damage during the test, because the danger of an excessive electric energy impact of the device under test 106 caused by the parasitic inductance is significantly reduced thanks to the implemented busbar mechanism 104.

Figure 2:
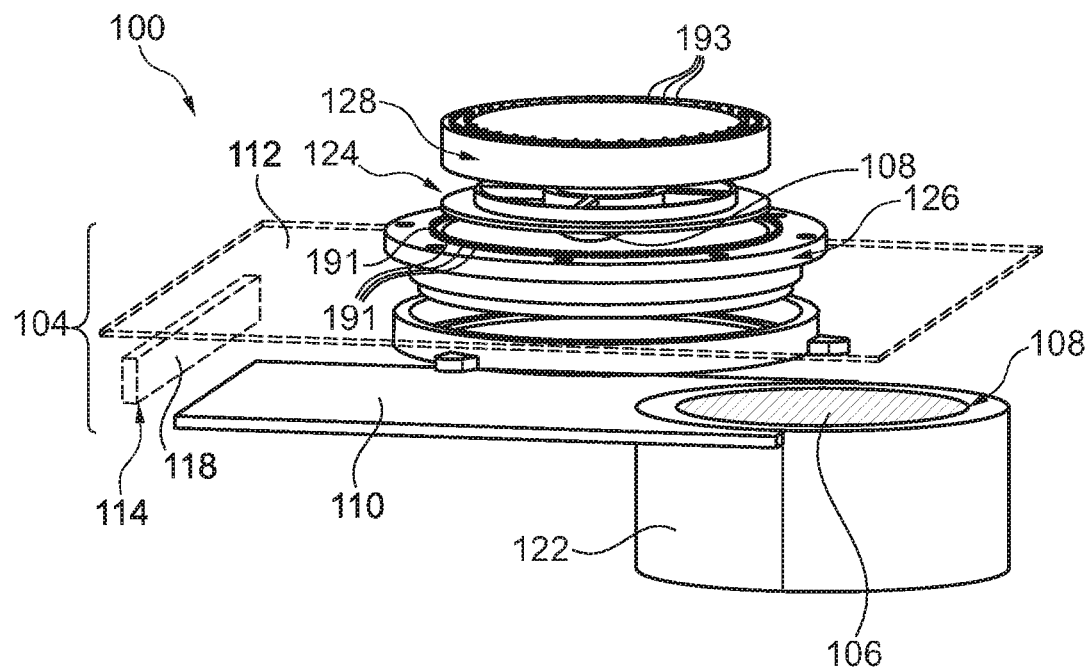
FIG. 2 shows a three-dimensional exploded view of a part of a prober according to an exemplary embodiment.
Figure 3:
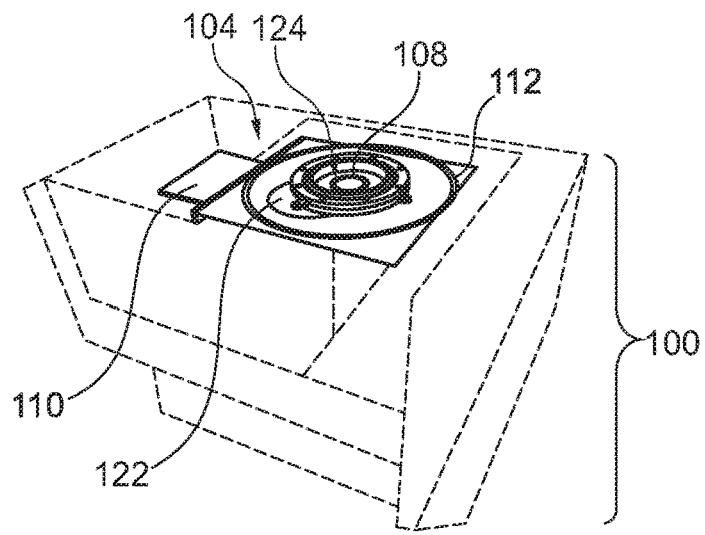
FIG. 3 shows a three-dimensional view of the prober according to FIG. 2.
Figure 4:
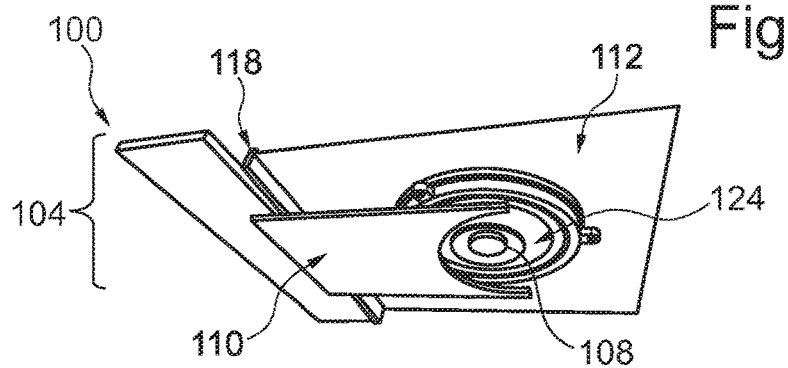
FIG. 4 shows a detail of the prober of FIG. 2 and FIG. 3.
Figure 5:
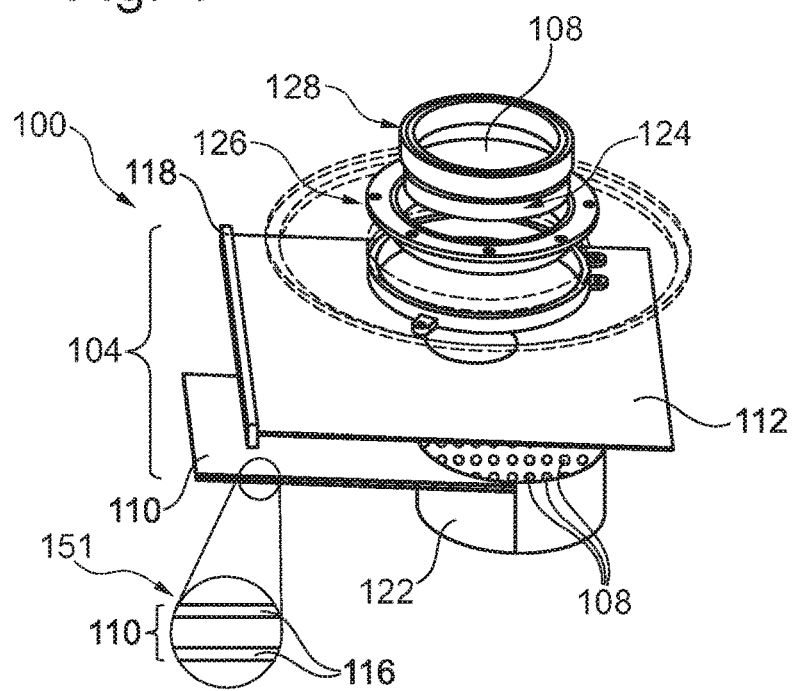
FIG. 5 shows an exploded view of the prober of FIG. 2 to FIG. 4.

FIG. 2 shows a three-dimensional exploded view of a part of a prober 100 according to an exemplary embodiment. FIG. 3 shows a three-dimensional view of the prober 100 according to FIG. 2. FIG. 4 shows a detail of the prober 100 of FIG. 2 and FIG. 3. FIG. 5 shows an exploded view of the prober 100 of FIG. 2 to FIG. 4.

As can be taken from FIG. 2 to FIG. 5, the second busbar plate 112 has a larger surface area than the first busbar plate 110. Both the first busbar plate 110 and the second busbar plate 112 may be optionally covered with an electrically conductive layer 116, as illustrated in a detail 151 of FIG. 5.

As shown, prober 100 comprises first contact ring 126 comprising multiple spring-loaded contact pins connected with the second busbar plate 112. Additionally, second contact ring 128 is provided which comprises multiple further spring-loaded contact pins connected to the needle card 124.

The busbar mechanism 104 is composed of one large fixed top busbar plate 112 (corresponding to a full usable width of the prober 100) and one smaller moving bottom busbar plate 110. Both busbar plates 110, 112 may be used to conduct electric current (which is in a standard prober carried by a long chuck cable).

A detachable contact between the two busbar plates 110, 112 may be accomplished by contact mechanism 114/contact bar 118. To obtain a strong busbar effect, the full width of the smaller lower busbar plate 110 can be contacted to the upper busbar plate 112. The contact can be closed when the touchdown is done (z-up, needles or contact elements 108 contact the device under test 106) and can be open when the chuck 122 is moved to a different position within a horizontal plane. To be independent from a probing overdrive (z-up distance), the linear contactor or bar 118 of the contact mechanism 114 can be actively moved down with each touchdown This can be implemented, for instance, with a pneumatic actuator mechanics.

The first contact ring 126 (which may also be denoted as an outer pogo tower) may contact the top busbar plate 112 and may carry the drain/collector current when a wafer with semiconductor power transistor chips shall be tested as device under test 106. The needle card 124 (which may also be denoted as probe card) may be seated in the first contact ring 126 and fastened and contacted with the second contact ring 128 (which may also be denoted as inner pogo tower). Hence, the fastening can be carried out by the inner pogo tower, or alternatively by another mechanical mechanism (in the latter case, the pogo tower only serves for establishing an electric contact). This inner pogo tower may carry the source/emitter current, gate and auxiliary signals when a wafer with semiconductor power transistor chips shall be tested as device under test 106.

On top of a prober head plate, the prober interface board may connect the upper sides of both pogo rings with the tester interface. This can be implemented as a fixed busbar assembly to maintain the low inductance up to the tester sources, but may also be implemented otherwise.

By implementing the contact rings 126, 128, the inductance reducing function of the busbar mechanism 104 may be continued in an upward direction. Therefore, the provision of the contact rings 126, 128 further reduces the parasitic impedance and therefore the risk to damage the device under test 106 during carrying out the test. Therefore, the yield during manufacture and testing of the device under test 106 may be significantly improved, in particular by the combination of the busbar mechanism 104 with the contact rings 126, 128.

Figure 6:
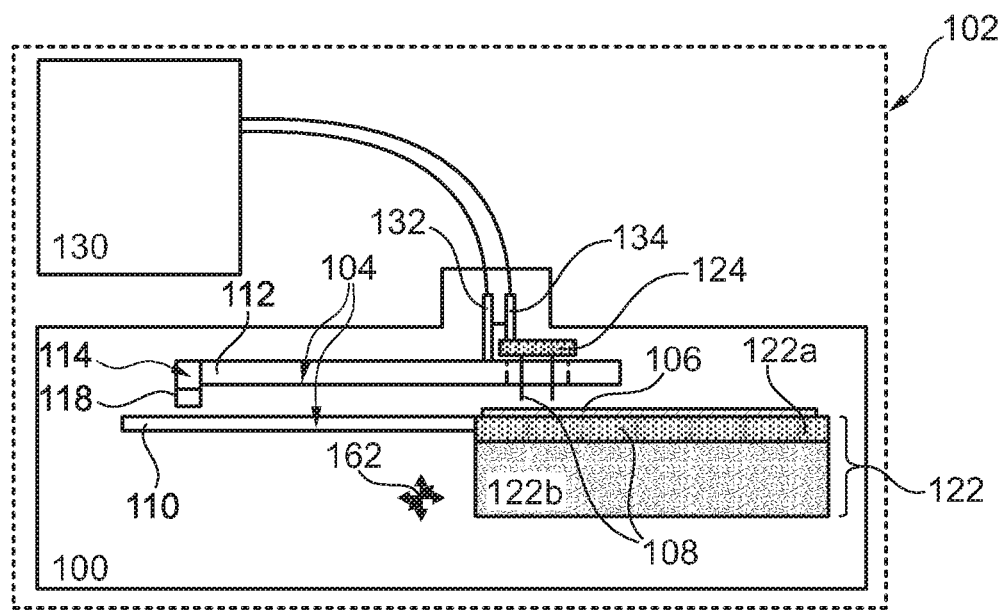
FIG. 6 shows a schematic view of a test system comprising an electric test unit and a prober according to another exemplary embodiment.

FIG. 6 shows a test system 102 comprising an electric test unit 130 and a prober 100 according to another exemplary embodiment.

The prober 100 according to FIG. 6 comprises a vertical first contact plate 132 connected with the second busbar plate 112 and comprises a vertical second contact plate 134 configured as a further vertical plate connected to the needle card 124.

FIG. 6 shows an alternative to the contact rings 126, 128 according to FIG. 1 to FIG. 5, however maintaining the concept of a low inductance. In the shown embodiment, the signals are additionally conducted by the vertical electrically conductive plates 132, 134 rather than providing contact rings 126, 128. Descriptively speaking, the vertical plates 132, 134 continue the principle of the busbar mechanism 104 and therefore contribute as well to the low impedance property of the test system 102.

While an electrically conductive connection is established between the busbar plates 110, 112 by the contact mechanism 114, the flow of electric signals is as follows: A first electric connection path is established between the electric test unit 130, via the first contact plate 132, the second busbar plate 112, the contact mechanism 114, the first busbar plate 110 and the contact elements 108 of the chuck 122 up to the lower main surface of the device under test 106. A second electric connection path is established between the electric test unit 130, via the second contact plate 134 and the needle card 124 with its multiple contact elements 108 up to the upper main surface of the device under test 106. A vertical current flow through the device under test 106 is possible as well.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A prober for a test system for testing a device under test, wherein the prober comprises:
    a busbar mechanism for transporting electric signals to and/or away from the device under test, wherein the busbar mechanism comprises:
    an at least partially electrically conductive first busbar plate for conducting an electric signal to and/or away from the device under test; and
    an at least partially electrically conductive second busbar plate for conducting the electric signal to and/or away from the device under test.

2. The prober according to claim 1, wherein the busbar mechanism is configured as a movable busbar mechanism.

3. The prober according to claim 1, configured as a wafer prober for testing chips on a wafer as device under test.

4. The prober according to claim 1, comprising electrically conductive contact elements for applying an electric stimulus signal to at least one side of the device under test and for detecting an electric response signal in response to the applied electric stimulus signal on at least one side of the device under test.

5. The prober according to claim 1, wherein the first busbar plate is a bottom side busbar plate, and the second busbar plate is a top side busbar plate.

6. The prober according to claim 1, wherein the first busbar plate is a movable busbar plate.

7. The prober according to claim 1, wherein the second busbar plate is a spatially fixed busbar plate.

8. The prober according to claim 1, wherein the second busbar plate has a larger surface area than the first busbar plate.

9. The prober according to claim 1, comprising a contact mechanism configured for selectively establishing or disabling an electric contact between the first busbar plate and the second busbar plate.

10. The prober according to claim 9, wherein the contact mechanism comprises an electrically conductive bar on the second busbar plate.

11. The prober according to claim 9, wherein the contact mechanism establishes an electric contact between the first busbar plate and the second busbar plate when the device under test is contacted by contact elements, and disables an electric contact between the first busbar plate and the second busbar plate while moving the first busbar plate and the second busbar plate relatively to one another, in particular in a horizontal plane.

12. The prober according to claim 1, comprising a chuck connected to the first busbar plate and configured for carrying the device under test.

13. The prober according to claim 12, wherein the chuck comprises electrically conductive contact elements connected to the first busbar plate and configured for contacting the device under test from a bottom side.

14. The prober according to claim 1, comprising a needle card comprising electrically conductive contact elements configured for contacting the device under test from a top side.

15. The prober according to claim 1, comprising one of the following features:
  comprising a first contact ring comprising multiple electric contacts, including multiple spring-loaded pins, connected with the second busbar plate and connectable with the first busbar plate and/or comprising a second contact ring comprising multiple electric contacts, in particular multiple further spring-loaded pins, connected to a needle card; and
  comprising a first contact plate, configured as a vertical plate, connected with the second busbar plate and connectable with the first busbar plate and/or comprising a second contact plate, in particular configured as a further vertical plate, connected to a needle card.

16. A test system for testing a device under test, wherein the test system comprises:
  a prober according to claim 1; and
  an electric test unit coupled with the prober for supplying electric stimulus signals to the prober and for analyzing electric response signals from the prober.

17. A method of testing a device under test, wherein the method comprises conducting an electric signal to and/or from the device under test by a prober according to claim 1, via a first busbar plate, a contact mechanism including the electrically conductive bar, and a second busbar plate.

18. The method according to claim 17, comprising at least one of the following features:
  wherein the method comprises testing chips on a wafer as the device under test, in particular chips on a wafer having a diameter of at least 200 mm, more particularly of at least 300 mm;
  wherein the method comprises testing, as the device under test, a wafer comprising a plurality of power semiconductor chips;
  wherein the method comprises testing, as the device under test, a wafer comprising a plurality of semiconductor chips having a vertical current flow between two opposing main surfaces;
  wherein the method comprises testing the device under test using non-constant signals or fast-changing signals.

19. A method which comprises retrofitting an existing wafer prober for a test system so that the retrofitted prober is configured for testing wafers with a busbar mechanism, in particular for retrofitting the existing wafer prober for providing a prober according to claim 1.

* * * * *